(12) United States Patent
Ishiwata

(10) Patent No.: US 8,134,620 B2
(45) Date of Patent: Mar. 13, 2012

(54) SOLID-STATE IMAGE-PICKUP DEVICE

(75) Inventor: Hiroaki Ishiwata, Tokyo (JP)

(73) Assignee: Sony Corporation, Tokyo (JP)

( * ) Notice: Subject to any disclaimer, the term of this patent is extended or adjusted under 35 U.S.C. 154(b) by 447 days.

(21) Appl. No.: 12/440,064

(22) PCT Filed: Aug. 2, 2007

(86) PCT No.: PCT/JP2007/065159
§ 371 (c)(1),
(2), (4) Date: Mar. 5, 2009

(87) PCT Pub. No.: WO2008/032502
PCT Pub. Date: Mar. 20, 2008

(65) Prior Publication Data
US 2010/0039545 A1 Feb. 18, 2010

(30) Foreign Application Priority Data
Sep. 11, 2006 (JP) ................. 2006-244992

(51) Int. Cl.
*H04N 3/14* (2006.01)
(52) U.S. Cl. .................. 348/294; 348/304; 348/308
(58) Field of Classification Search ............. 348/272, 348/284–324; 257/432, 435, 448
See application file for complete search history.

(56) References Cited

U.S. PATENT DOCUMENTS 7,595,822 B2 * 9/2009 Sakamoto et al. ......... 348/230.1
7,859,587 B2 * 12/2010 Katsuno et al. ............ 348/340

FOREIGN PATENT DOCUMENTS

| JP | 11-186530 | 7/1999 |
|---|---|---|
| JP | 2003-273342 | 9/2003 |
| JP | 2004-253568 | 9/2004 |
| JP | 2006-237315 | 9/2006 |

OTHER PUBLICATIONS

International Search Report Dated Oct. 23, 2007.

* cited by examiner

*Primary Examiner* — Mohammed Hasan
(74) *Attorney, Agent, or Firm* — SNR Denton US LLP

(57) ABSTRACT

A solid-state image device including a pixel-array section forming an image pick-up region and a wiring layer including wiring lines and contact units. In one embodiment, each of the contact units and wiring lines is provided for a respective pixel in the pixel-array section, and the image-pickup region is divided into a first region and a second region with respect to a central portion of the image-pickup region. Further, positions of contact units and wiring lines arranged in the first region are opposite to positions of corresponding contact units and wiring lines arranged in the second region.

9 Claims, 5 Drawing Sheets

(A)

(B)

(A)

(B)

SOLID-STATE IMAGE-PICKUP DEVICE

TECHNICAL FIELD

The present invention relates to a solid-state image-pickup device such as a CMOS image sensor or a CCD image sensor, and, more particularly, to a solid-state image-pickup device having microlenses and wiring patterns that were subjected to pupil correction.

BACKGROUND ART

Hitherto, in a CMOS image sensor, each pixel includes, not only a photodiode (PD) that photoelectrically converts incident light, but also transistors including a transistor (TG) that transfers an electric signal which is obtained by photoelectric conversion, a reset transistor (RST), an amplification transistor (AMP), and so forth, and a floating diffusion (FD) unit. When light leaks into these active regions, photoelectric conversion occurs. A false signal is generated by electrons that are produced as a result of the photoelectric conversion, and is regarded as noise. Accordingly, generally, the regions are blocked from light in the CMOS image sensor in order to prevent light from entering the regions. Additionally, wiring lines including a signal line that transmits an electric signal which is amplified by the amplifier transistor, control signal lines that drives the above-mentioned transistors, a power-supply line, and so forth run, and the wiring lines prevent light from reaching the photodiode.

In contrast, in a CCD image sensor, each pixel includes, not only a photodiode region, but also a vertical CCD transfer region for transferring charge which is obtained by photoelectric conversion. Because a false signal is generated when light enters this region, the region must be blocked from light.

As described above, a light-blocking region is formed in a unit pixel in an image sensor.

Accordingly, in an image sensor of the relate art, a technique is proposed and put into practical use, in which a microlens and an in-layer lens are formed above a photodiode for each pixel in order to efficiently collect light onto the photodiode while preventing light from entering a light-blocking region that is formed in the pixel.

However, in this case, the angle of the main light ray that enters a photodiode is typically 0° in a pixel that is provided in the central portion of an image-pickup region (a pixel-array section), and the light perpendicularly enters the photodiode. In contrast, generally, the main light ray enters a photodiode at a certain angle in a pixel that is provided in the peripheral portion of the image-pickup region. Specifically, generally, the main light ray for a pixel that is provided in the peripheral portion of the image-pickup region enters a photodiode with an inclination in a direction away from the central portion of the image-pickup region.

As a result, in the central portion of the image-pickup region, matching of the center of the aperture of a photodiode to the center of a microlens and an in-layer lens is performed. However, in the peripheral portion of the image-pickup region, when matching of the center of the aperture of a photodiode to the center of a microlens and an in-layer lens is performed, an optical axis is inclined with respect to inclined incident light, and one portion of the incident light enters the outside of the photodiode, resulting in occurrence of a shading phenomenon.

Hence, in order to deal with this phenomenon, a technique is proposed and put into practical use, in which a microlens, a color filter, and an in-layer lens are arranged in the peripheral portion of the image-pickup region in such a manner that the position thereof is shifted by an offset in a direction to the center side of the image-pickup region so that the position can be suitable for the optical axis of incident light, thereby avoiding shading that occurs in a photodiode (for example, see Japanese Unexamined Patent Application Publication No. 11-186530). This technique is called a pupil correction technique, and is applied to a wiring line, a contact, a via, and so forth.

In this case, if the wiring line, the microlens, and so forth in a layout in the peripheral potion of the image-pickup region are moved parallel, the layout in the peripheral potion of the image-pickup region coincides with a layout in the central portion of the image-pickup region.

However, in a case in which the above-described pupil correction technique is performed, regarding a microlens and an in-layer lens, because a shift amount by which the microlens and the in-layer lens are to be shifted by pupil correction is not limited, optimization can be easily performed. However, regarding a wiring line, limitations are imposed on a shift amount of the wiring line in accordance with the arrangement of elements in a pixel, the shape of the aperture of a photodiode or the like.

Hence, as a specific example of these limitations, a pixel using a three-layer metal-wiring structure is described as an example. FIG. 6 is a schematic plan view showing an arrangement of elements in the vicinity of an FD unit in a case of three-layer metal wiring.

In the figure, in each pixel, a vertical signal line that transmits, as an electric signal, a signal which is obtained by photoelectrical conversion, and an internal wiring line 114 that connects an FD unit 112 to the gate (not illustrated) of an amplifier transistor are formed commonly using a wiring film that is a second layer. In addition, a contact unit 116 connects the FD unit 112 and the internal wiring line 114.

Note that a wiring line that both blocks light and serves as a power-supply line is formed, as a metal wiring film that is a third layer, on the wiring lines that are illustrated.

In this wiring structure, when the vertical signal line 110 is moved and used for pupil correction, the vertical signal line 110 can be relatively freely moved in a direction away from the contact unit 116 (i.e., the right direction (indicated by the arrow A) shown in the figure). However, regarding the opposite direction (i.e., the left direction (indicated by the arrow B) shown in figure), because the position of the contact unit 116, which connects the FD unit 112 to the internal wiring line 114, cannot be moved, when the vertical signal line 110 is moved by a large amount, the vertical signal line 110 comes into contact with the contact unit. Accordingly, it is impossible to move the vertical signal line 110 with a sufficient flexibility.

Thus, for example, when a pixel is to be miniaturized in a state in which there is no advance of a process generation and in which design rules are not changed, supposing that the number of wiring lines which are to be mounted in a unit pixel is not decreased, a maximum movement amount (a pupil-correction amount) by which a wiring line can be shifted by pupil correction is determined under layout constraints. When the pupil-correction amount of a wiring line is smaller than a pupil-correction amount of a wiring line that is obtained using simulation or theoretical calculation, pupil correction is not sufficiently performed on a wiring line in the peripheral portion of the image-pickup region. Shading that is caused by the wiring line occurs, and sensitivity is decreased.

Furthermore, when a light ray that is generated due to shading leaks into adjacent pixels because of a reflection or refraction phenomenon, degradation in image quality which is called color mixture occurs.

Hence, the present invention aims to provide a solid-state image-pickup device that can perform pupil correction on wiring lines with a high flexibility by improving an arrangement structure of wiring layers.

DISCLOSURE OF INVENTION

In order to achieve the above-mentioned aim, a solid-state image-pickup device of the present invention is characterized by including: a pixel-array section in which a plurality of photoelectric conversion units are arranged in two-dimensional directions on a semiconductor substrate; a wiring layer in which an insulator film and a wiring film are stacked on a top portion of the pixel-array section, and in which some of wiring lines are connected to the semiconductor substrate side via contact units; and microlenses that are arranged on the wiring layer, and that are formed so as to have a pitch which is used for pupil correction, the pitch being different from a pitch of the photoelectric conversion units in the pixel-array section. The wiring layer includes at least two divided regions that are obtained by dividing the wiring layer into regions on peripheral portion sides with respect to a central portion side of the pixel-array section, and predetermined contact units and predetermined wiring lines, each of the predetermined contact units and predetermined wiring lines being provided for a corresponding one of the pixels of the pixel-array section, are arranged so that positions of the predetermined contact units and predetermined wiring lines in one of the two divided regions are opposite to positions of the corresponding predetermined contact units and predetermined wiring lines in the other of the two divided regions.

According to the present invention, the wiring layer of the solid-state image-pickup device includes at least two divided regions that are obtained by dividing the wiring layer into regions on peripheral portion sides with respect to a central portion side of the pixel-array section, and contact units and wiring lines, each of the contact units and wiring lines being provided for a corresponding one of the pixels of the pixel-array section, are arranged so that positions of the contact units and wiring lines in one of the two divided regions are opposite to positions of the corresponding contact units and wiring lines in the other of the two divided regions. Thus, a contact unit can be arranged on a side opposite to the side that is located in a direction in which pupil correction is performed on a wiring line at the position of each of the pixels of the image-pickup region. Pupil correction can be performed by freely moving the wiring layer without being interfered with the contact unit.

Therefore, pupil correction can be performed with a high flexibility, and a light receiving efficiency and uniformity can be improved over the entire image-pickup region. An effect that can contribute to improvement in image quality of the solid-state image-pickup device or the like is obtained.

BEST MODES FOR CARRYING OUT THE INVENTION

Figure 1:
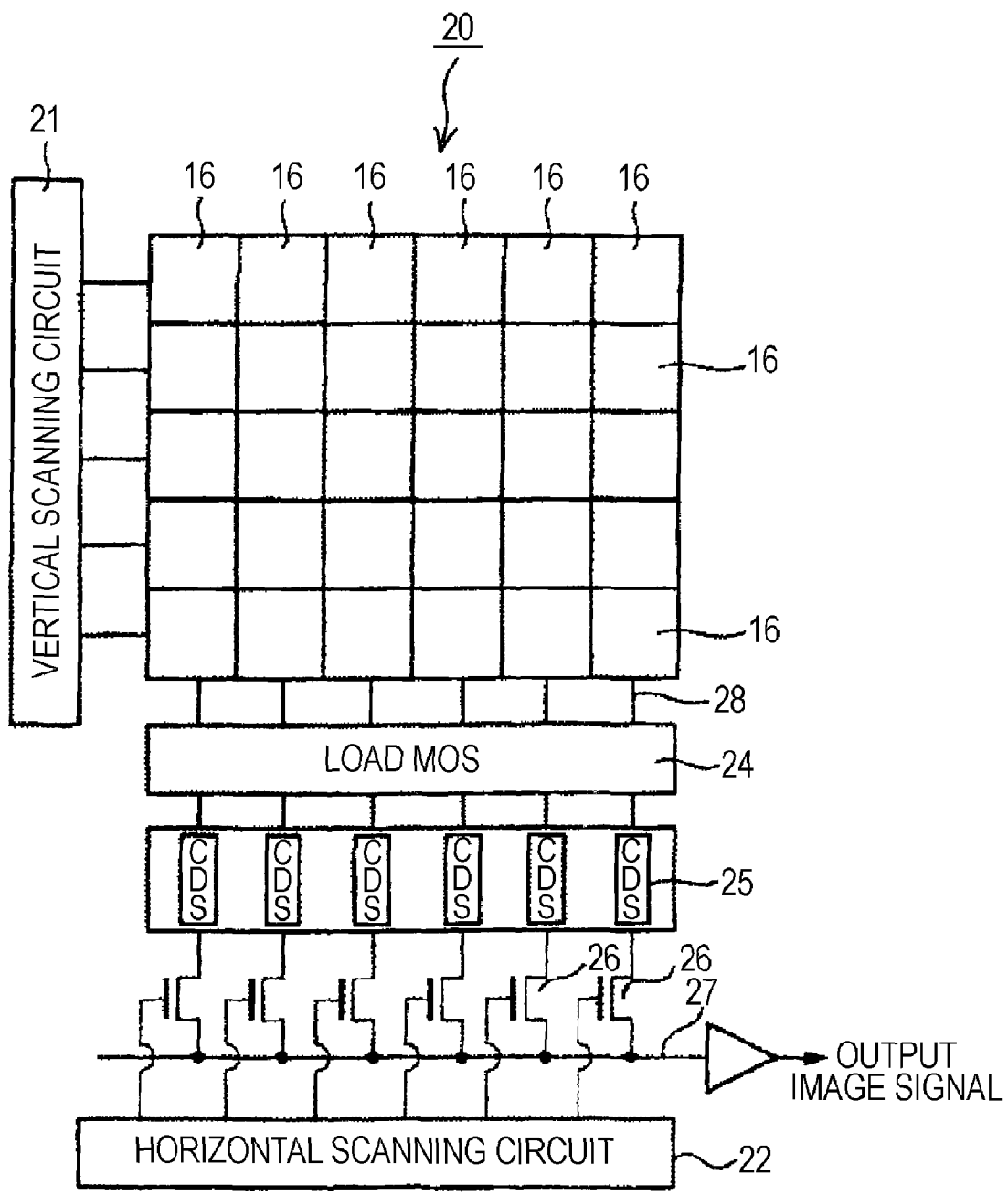
FIG. 1 is a block diagram showing the outline of a solid-state image-pickup device according to an embodiment of the present invention.
Figure 2:
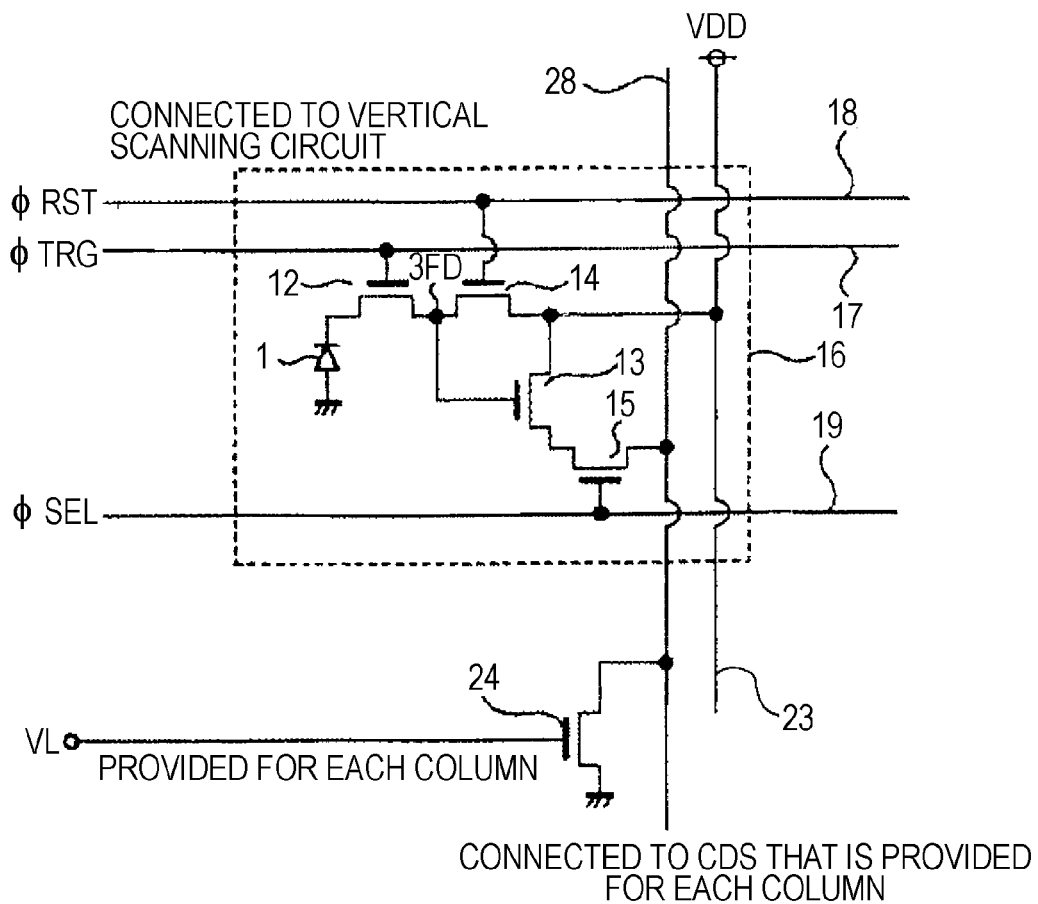
FIG. 2 is a circuit diagram showing a configuration of a pixel circuit of the solid-state image-pickup device shown in FIG. 1.

FIG. 1 is a plan view showing a specific example of a solid-state image-pickup device according to an embodiment of the present invention, and shows an example of a CMOS image sensor. Additionally, FIG. 2 is a circuit diagram showing a configuration of a circuit in a pixel of the solid-state image-pickup device shown in FIG. 1. Note that, although the below description of the embodiment will be mainly concerned with a CMOS image sensor, similarly, the present invention can also be applied to a CCD image sensor.

As shown in FIG. 1, the solid-state image-pickup device of the embodiment includes: a pixel-array section 20 that configures an image-pickup region using a plurality of pixels 16 which are arranged in two-dimensional directions; a vertical scanning circuit 21 that controls an operation of reading pixel signals by scanning the respective pixels of the pixel-array section 20 in the vertical direction; a load MOS-transistor circuit 24 that controls vertical signal lines 28 which lead out from respective pixel columns of the pixel-array section 20; CDS circuits 25 that take the pixel signals which are read from the respective pixel columns of the pixel-array section 20, and that performs noise reduction using a correlated double sampling process; horizontal selection transistor circuits 26 that output, to a horizontal signal line 27, the pixel signals which are supplied from the CDS circuits 25; and a horizontal scanning circuit 22 that sequentially selects the horizontal selection transistor circuits 26 in the horizontal direction to control outputting of the pixel signals.

The pixel signals that are output to the horizontal signal line 27 are transmitted to the subsequent circuit via a buffer amplifier.

Furthermore, as shown in FIG. 2, each of the pixels 16 includes: a photodiode (PD) 1 that photoelectrically converts incident light; a transistor (TG) 12 that transfers an electric signal, which is obtained by photoelectric conversion, to a floating diffusion (FD) unit 3 on the basis of a transfer pulse (ΦTRG); a reset transistor (RST) 14 that resets the potential of the FD unit 3 to a power-supply voltage VDD on the basis of a reset pulse (ΦRST); an amplifier transistor (AMP) 13 that converts a change in the potential of the FD unit 3 to a voltage signal or a current signal; and a selection transistor 15 that connects the output of the amplifier transistor 13 to a corresponding one of the vertical signal lines 28 on the basis of a selection signal (ΦSEL).

Accordingly, in the vicinity of the pixel 16, the vertical signal line 28, a power-supply line, and so forth are arranged in the vertical direction, and a read line 17, a reset line 18, a selection line 19, and so forth are arranged in the horizontal direction.

As described above, in a solid-state image-pickup device of the related art, when pupil correction is performed on wiring lines in the peripheral portion of an image-pickup region, there has been a problem that it is impossible to sufficiently perform pupil correction on the wiring lines because other components such as contact units are obstructions.

The problem is caused because the basic layout of a pixel (the positional relationships between wiring lines) is commonly used over the entire image-pickup region although the direction in which wiring lines are desired to be shifted by pupil correction differs depending on portions of the image-pickup region. In other words, in a case in which it is considered that the pixel-array section (the image-pickup region) is divided in two, the left and right sides, when pupil correction is performed on wiring lines, wiring lines are shifted in the left direction in a region on the right side of the image-pickup region, and wiring lines are shifted in the right direction in a region on the left side of the image-pickup region. Accordingly, in a layout in which obstructions such as contact units exist at the right side of wiring lines, regarding the wiring lines that are desired to be shifted in the right direction on the left side of the image-pickup region, there is insufficient flexibility in pupil correction. In contrast, when the obstructions exist at the left side of wiring lines, regarding the wiring lines that are desired to be shifted in the left direction on the right side of the image-pickup region, there is no flexibility. In other words, a region in which obstructions exist in a direction in which wiring lines are desired to be shifted by pupil correction and a region in which obstructions exist on a side opposite to the side that is located in the direction in which wiring lines are desired to be shifted by pupil correction are mixed, and effective performance of pupil correction is limited as a whole.

Note that, similarly, also in a case in which it is considered that the pixel-array section (the image-pickup region) is divided in four, the top and bottom sides, and right and left sides, a region in which obstructions exist in a direction in which wiring lines are desired to be shifted by pupil correction and a region in which obstructions exist on a side opposite to the side that is located in the direction in which wiring lines are desired to be shifted by pupil correction are mixed, and sufficient performance of pupil correction is limited as a whole.

Hence, in the embodiment of the present invention, the positional relationships between wiring lines (specifically, vertical signal lines and contact units) are changed for each divided region of the pixel-array section (the image-pickup region), thereby arranging the contact units on a side opposite to the side that is located in a shift direction in which the vertical signal lines are desired to be shifted by pupil correction. Pupil correction can be sufficiently performed by ensuring a sufficient shift amount of the vertical signal lines, and the effect of the correction is improved.

Furthermore, in this embodiment, the image-pickup region is divided in two in a direction in which the number of pixels is larger, and the positional relationships between wiring lines and contact units are changed for each divided region.

For example, standards of an image-pickup element are considered. In an HDTV standard, an aspect ratio (a ratio of the horizontal size to the vertical size) is 16:9. In an NTSC standard, the aspect ratio is 4:3. In a camera of a single-lens reflex type, the aspect ratio is 3:2. In other words, in all of the standards, a size in the latitudinal direction (a size in the horizontal direction) is longer than a size in the longitudinal direction (a size in the vertical direction). Accordingly, when image-pickup elements are realized using tetragonal lattices, the number of pixels in the horizontal direction is larger than the number of pixels in the vertical direction. In addition, also when shifted pixels, which are realized by arranging square pixels that are unit pixels at an oblique angle of 45°, are used, the number of pixels in the horizontal direction is larger than the number of pixels in the vertical direction. In addition, generally, the angle of an incident light ray tends to increase as the height of an image increases. In a case of an aspherical lens, the angle of an incident light ray increases until the height of an image reaches a certain value, and, after that, the angle of an incident light ray remains substantially constant or slightly decreases in some cases.

In any case, a pupil-correction amount in the horizontal direction tends to be larger than a pupil-correction amount in the vertical direction.

Figure 3:
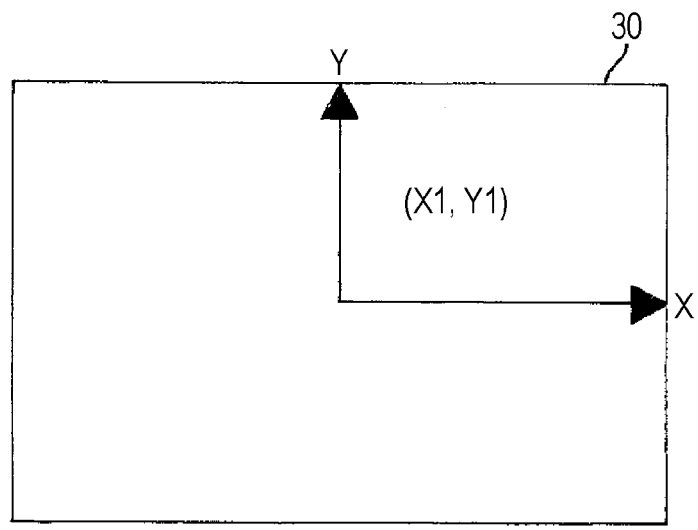
FIG. 3 is an explanatory diagram showing X-Y coordinates of an image-pickup region.

Hence, next, the following description is made with reference to coordinates of the image-pickup region shown in FIG. 3. First, (0, 0), which is the center of effective pixels of an image-pickup region 30, is set as an origin. An X axis is set in the horizontal direction, and a Y axis is set in the vertical direction. A Z axis is set in an optical-axis direction from an image-pickup surface. The positions of the respective pixels are identified using the coordinates. The central coordinates of a photodiode of a pixel is set to (X1, Y1) where X1>0 and Y1>0.

Here, it is considered that pupil correction is performed on microlenses. Supposing that optimum offset amounts, which are determined using optical simulation or the like, are Xm1 (>0) for the X axis and Ym1 (>0) for the Y axis, the coordinates of a microlens of the pixel are (X1−Xm1, Y1−Ym1). The coordinates of a pixel that is located symmetrically with respect to the Y axis are (−X1, Y1), and the optimum coordinates of a microlens are (−X1+Xm1, Y1−Ym1).

When pupil correction is applied in this manner, a position at which the microlens is offset in a direction to the central portion of the image-pickup region is the optimum position for forming the microlens in the peripheral portion of the image-pickup region.

However, metal wiring lines, via plugs, and contact plugs need to satisfy conditions for electrical connection to a lower layer, which is different from the case of microlenses, in-layer lenses, and color filters. Once a layout for the center is determined, an allowable pupil-correction amount is inevitably determined in accordance with design rules and connection relationships.

Hence, supposing that pupil-correction amounts for a metal wiring line are −Xm2 for the X axis and −Y2 for the Y axis, coordinates of metal wiring lines that were subjected to pupil correction are (X1−Xm1, Y1−Ym2) for the position of a pixel whose coordinates are (X1, Y1), (X1−Xm2, −Y1+Ym2) for the position of a pixel whose coordinates are (X1, −Y1), (−X1+Xm1, Y1−Ym2) for the position of a pixel whose coordinates are (−X1, Y1), and (−X1+Xm1, −Y1+Ym2) for the position of a pixel whose coordinates are (−X1, −Y1). The direction in which a component is to be shifted by pupil correction and the position to which the component is to be shifted by pupil correction differ depending on the position of each pixel.

In other words, pupil correction is to be performed in various directions in the peripheral portion of the image-pickup region. It is impossible to provide, particularly for a fine pixel which is a size-reduced pixel and for which limitations are imposed on to an allowable shift amount of a wiring line or the like, a layout satisfying all of the above requirements for pupil correction.

Hence, in this embodiment, wiring layouts using an advantage that the direction in which pupil correction is to be performed differs depending on the position of each pixel are applied. For example, the direction in which pupil correction is to be performed on wiring lines is only the −X (<0) direction in a region in which the positions of pixels are +X (>0), and the direction in which pupil correction is to be performed on wiring lines is only the +X (>0) direction in a region in which the positions of pixels are −X(<0). Accordingly, a wiring layout in which pupil correction is to be easily performed in the −X direction is used in the region in which the positions of pixels are +X, and a wiring layout in which pupil correction is to be easily performed in the +X direction is used in the region in which the positions of pixels are –X, whereby flexibility in pupil correction is increased over the entire image-pickup region.

Figure 4:
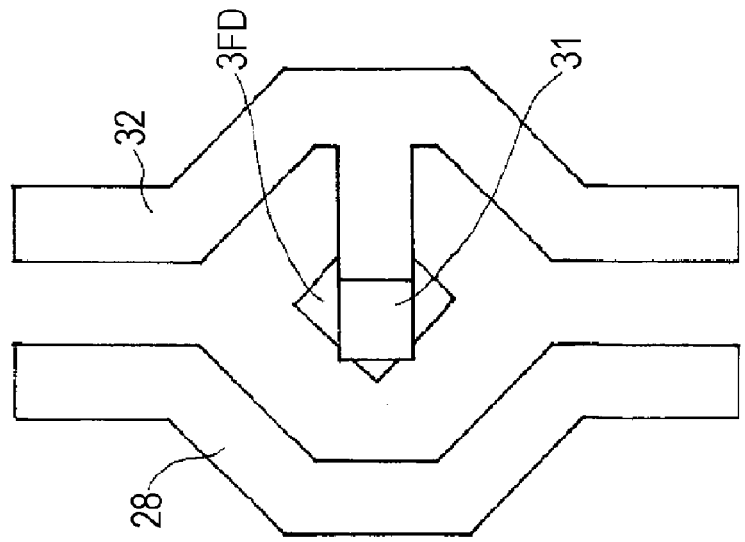
FIG. 4 includes schematic plan views showing specific examples of wiring layouts that are employed in the solid-state image-pickup device shown in FIG. 1.
Figure 4:
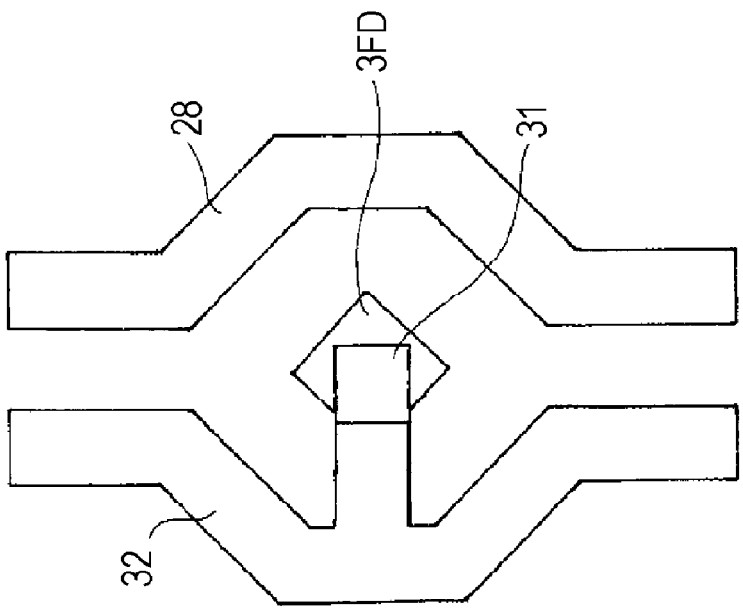

FIG. 4 includes schematic plan views showing specific examples of wiring layouts that are employed in this embodiment, and shows the positional relationships among the vertical signal lines 28, contact units 31 for providing connection to FD units 3, and internal wiring lines 32 that connect the contact units 31 to amplifier transistors.

In FIG. 4, wiring lines for pixels that are arranged in two divided regions, which are obtained by dividing the image-pickup region into regions on peripheral portion sides with respect to the central portion side of the image-pickup region, on the left and right sides are shown. Part (A) of FIG. 4 shows wiring lines that are provided at the position of a pixel which is arranged on the left side (the –X side) with respect to the center of the image-pickup region. Part (B) of FIG. 4 shows wiring lines that are provided at the position of a pixel which is arranged on the right side (the +X side) with respect to the center of the image-pickup region.

As shown in part (A) of FIG. 4, in a pixel that is arranged on the left side of the image-pickup region, the contact unit 31 and the wiring line 32 are arranged on the left side, and the vertical signal line 28 is arranged on the right side.

In contrast, as shown in part (B) of FIG. 4, in a pixel that is arranged on the right side of the image-pickup region, the contact unit 31 and the wiring line 32 are arranged on the right side, and the vertical signal line 28 is arranged on the left side.

Figure 5:
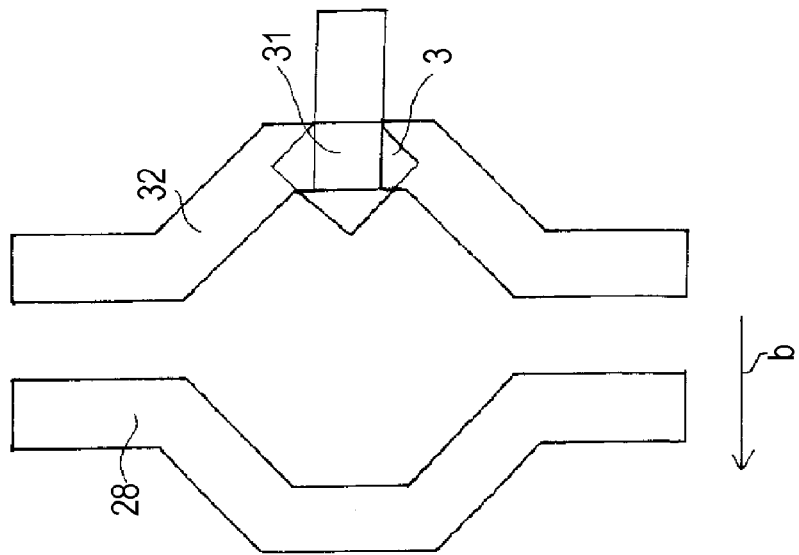
FIG. 5 includes schematic plan views showing specific examples of cases in which wiring lines of respective pixels shown in FIG. 4 were subjected to pupil correction.
Figure 5:
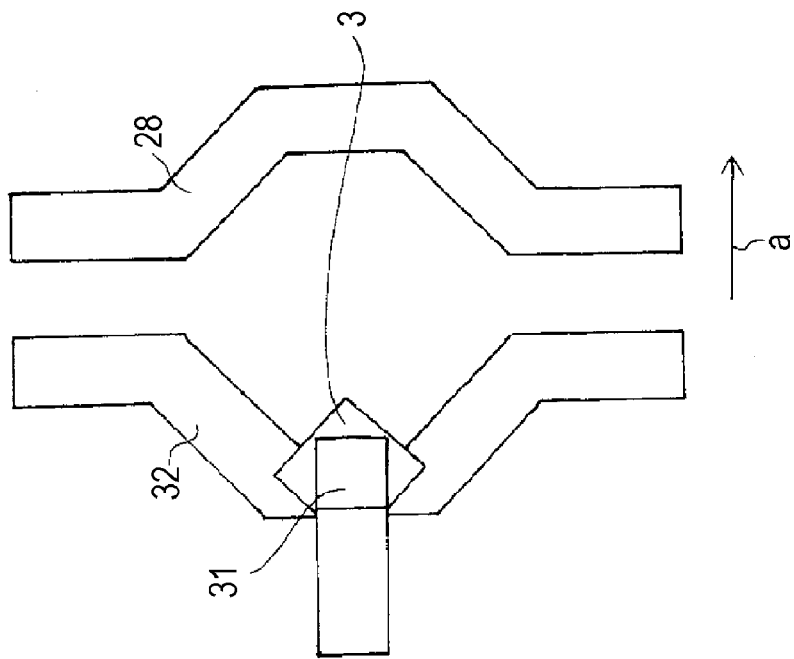
Figure 6:
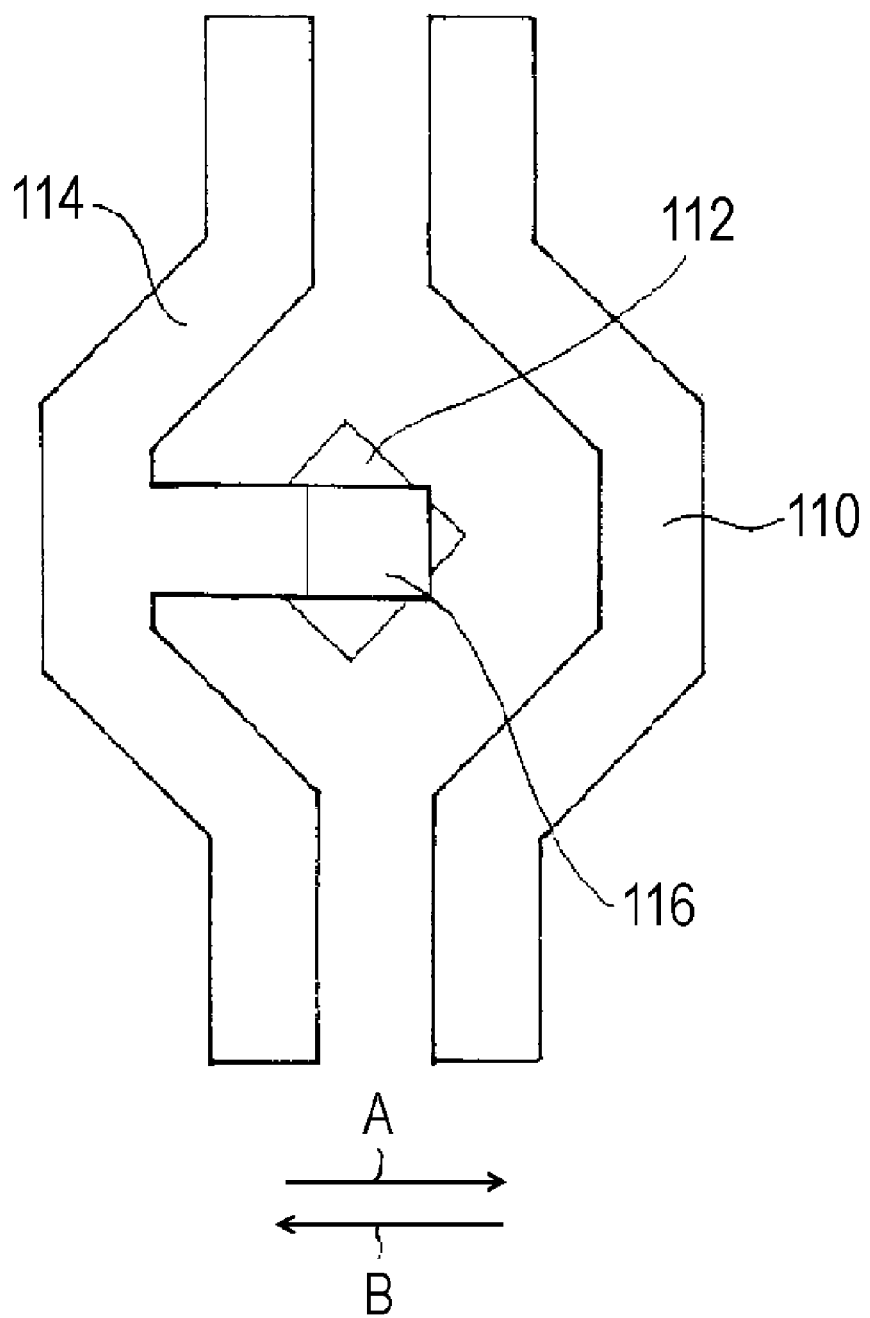
FIG. 6 is a schematic plan view showing a specific example of a wiring layout that is employed in a solid-state image-pickup device of the related art.

FIG. 5 includes schematic plan views showing specific examples of cases in which the wiring lines of the respective pixels shown in FIG. 4 were subjected to pupil correction. Part (A) of FIG. 5 corresponds to part (A) of FIG. 4, and part (B) of FIG. 5 corresponds to part (B) of FIG. 4.

Effects of the above-described wiring will be described below. Note that, here, for simplicity of description, the following description is made under the assumption that the two pixels shown in FIG. 4 are simply arranged on the X axis. Accordingly, it is only necessary to consider the X directions as directions in which pupil correction is to be performed for the pixels.

First, in the pixel on the left side of the image-pickup region shown in part (A) of FIG. 4, the direction in which pupil correction is to be performed on the wiring lines is the +X direction. In the pixel on the left side of the image-pickup region, when pupil correction is performed on the wiring lines, the wiring lines 28 and 32 are shifted in a direction to the center of the image-pickup region. In other words, as shown in part (A) of FIG. 5, the wiring lines 28 and 32 are shifted in the right direction (the direction indicated by the arrow a).

Similarly, in the pixel on the right side of the image-pickup region, when pupil correction is performed on the wiring lines, the wiring lines 28 and 32 are shifted in a direction to the center of the image-pickup region. In other words, as shown in part (B) of FIG. 5, the wiring lines 28 and 32 are shifted in the left direction (the direction indicated by the arrow b).

If a layout of the pixel on the left side shown in part (A) of FIG. 4 is made as in the case of a layout of the pixel on the right side shown in part (B) of FIG. 4, the vertical signal line 28 is not able to be moved in the right direction since it is necessary to ensure a space that is defined in design rules between the wiring line 32, which is connected to the contact unit 31 that is not able to be moved because of connection to the FD unit 3, and the vertical signal line 28. Thus, in the peripheral portion of the image-pickup region, incident light is blocked by the vertical signal line which is not able to be moved (on which pupil correction is not able to be performed), and this causes a decrease in sensitivity, or color mixture.

In contrast, as in this embodiment, by using an advantage that a direction in which pupil correction is to be performed is specifically determined in accordance with the position of a pixel, the basic layout is changed in accordance with the position at which a pixel is arranged, whereby the flexibility in pupil correction is increased, so that shading which is caused by wiring lines can be suppressed. A decrease in sensitivity can be avoided, and color mixture can be avoided.

Note that, in the embodiment shown in FIG. 4, an example is described, in which pixels are divided in two, pixels that are provided in the positive direction of the X axis and pixels that are provided in the negative direction of the X axis, with respect to the origin of the image-pickup region shown in FIG. 3, and the pixels on the X axis are described. However, similarly, movements in the X directions can also be applied to pixels that are not provided on the X axis. Furthermore, as described above, because, generally, the number of pixels that are arranged in the directions of the X axis is larger than that of pixels that are arranged in the directions of the Y axis, the correction amounts in the X directions are larger. Thus, an effect can be expected, in which the flexibility in pupil correction is increased to some degree simply by dividing the image-pickup region in two, the left and right halves, also with respect to the Y axis.

However, as an example in which the design is further improved, the image-pickup region is divided in four, the top and bottom sides, and the right and left sides, with respect to the origin that is the center of the image-pickup region, and the basic layout is changed for each pixel, whereby the flexibility in pupil correction is further increased, so that image quality can be improved. For example, regarding wiring lines corresponding to the above-mentioned signal lines in the horizontal direction shown in FIG. 2, the wiring lines are arranged so that the positional relationships between the wiring lines and contact units on the top side of the image-pickup region are opposite to the positional relationships between the wiring lines and contact units on the bottom side of the image-pickup region, whereby an improvement in the flexibility in pupil correction can be expected.

With the above-described embodiment of the present invention, various effects can be obtained in fields of application given below.

For example, when a camera is to be mounted in a mobile terminal such as a mobile phone, there is a strong demand for the small thickness of a lens module (one module into which a lens and an image-pickup element are integrated) so that the lens module has a small thickness with which the lens module can be mounted in the mobile terminal. Regarding a lens that is used in such a case, a lens having a short exit pupil distance is used in most cases. When the lens having a short exit pupil distance is used, the incident angle of the main light ray tends to be large in the peripheral portion of the image-pickup region, and a large pupil-correction amount is necessary in order to perform pupil correction so that the pupil correction is suitable for the optical axis of the lens.

Additionally, no flash capable of emitting light to obtain a sufficient light amount has been mounted in the mobile terminal so far because of physical constraints. In order to obtain a shutter speed fast enough to avoid image shake caused by hand motion, there is a tendency to use a lighter lens having a small F value such as F2.8. However, when the lens having a small F value is used, light does not easily enter a photodiode because the angle of the sub-light ray is large.

Furthermore, regarding the lens module into which an image-pickup element and a lens are integrated, in order to easily design the next product, there is a tendency to decrease the pixel size of an image sensor while the optical size remains as a fixed size, thereby increasing the number of pixels. In this case, the pixel size is reduced while the angle of the main light ray remains large.

Moreover, as described above, it is necessary to perform pupil correction not only on microlenses, color filters, and in-layer lenses but also on metal wiring lines, vias, and contacts, which are necessary to satisfy conditions for electrical connection. Otherwise, shading that is caused by wiring lines or the like occurs, and causes a decrease in sensitivity and color mixture. In contrast, because a metal-wiring width and a metal-wiring space of a wiring line are defined as design rules on the basis of a metal-wiring process, a range in which pupil correction can be performed is limited in an actual layout. For example, it is supposed that, although 0.5 µm is necessary as an offset amount of a wiring line as a result of theoretical calculation or optical simulation, an allowable offset amount is only at most 0.3 µm in a layout satisfying the design rules. In this case, because it is impossible to sufficiently perform pupil correction on wiring lines in the peripheral portion of the image-pickup region, shading that is caused by wiring lines occurs, and sensitivity is decreased in the peripheral portion of the image-pickup region. When light that is blocked by the wiring lines leaks to adjacent pixels, color mixture occurs.

In contrast, in a method of the related art, because only one basic layout for performing pupil correction was provided, it was impossible to sufficiently perform pupil correction. However, in this embodiment, the advantage that a direction in which pupil correction is to be performed is determined in accordance with the position at which a pixel is arranged is used, so that the flexibility in pupil correction can be increased by changing the basic layout in accordance with the position at which a pixel is arranged.

For example, in a case in which pupil correction is to be realized at all positions of pixels by using one pixel layout, supposing that an amount by which a wiring line can be shifted in the right direction in the above-described pixel on the left side of the image-pickup region is H1, and that an amount by which a wiring line can be shifted in the left direction in the pixel on the right side of the image-pickup region is H2, an amount by which pupil correction can be equally performed in the image-pickup region is the minimum between the absolute values of H1 and H2. In contrast, in a case in which the image-pickup region is divided in two, the left and right sides, with respect to the Y axis, and in which the basic layout of a pixel is changed so that the basic layout of a pixel on the right side and the basic layout of a pixel on the left side are different from each other, pupil correction can be performed with a pupil-correction amount that is about twice a pupil-correction amount in the related art.

Note that the above-described embodiment is one example of the present invention, and that further modifications can be made to the present invention. For example, although a CMOS image sensor is described as one example in the embodiment, similarly, the embodiment can also be applied to a CCD image sensor. In addition, although an example in which the positional relationships between a vertical signal line and a contact unit for FD is improved is described in the embodiment, similarly, the embodiment can also be applied to a case in which the positional relationships between other wiring lines, and a contact or a via is changed.

Moreover, in the embodiment, an example of divided regions that are obtained by dividing the image-pickup region in two, the top and bottom sides, or the left and right sides, or in four, the top and bottom sides, and the right and left sides, with respect to the center of the image-pickup region is described. However, various methods can be employed as methods for providing divided regions in accordance with actual circumstances for pupil correction or the like. For example, an embodiment can be provided, in which a region in which the positional relationships among wiring lines are changed is provided only in the peripheral region of the image-pickup region excluding the center region.

The invention claimed is:

1. A solid-state image-pickup device comprising:
a pixel-array section in which a plurality of photoelectric conversion units are arranged two-dimensionally in horizontal and vertical directions on a semiconductor substrate, the pixel-array section forming an image-pickup region;
a wiring layer on the pixel-array section, the wiring layer including an insulator film and a wiring film that are stacked on the pixel-array section, and the wiring layer including a plurality of first wiring lines that are connected to another layer on a semiconductor substrate side via a like plurality of contact units; and
microlenses arranged on the wiring layer, the microlenses having a pitch that is used for pupil correction, the pitch being different from a pitch of the photoelectric conversion units in the pixel-array section,
wherein
the image-pickup region is divided into a plurality of regions with respect to a central portion of the image-pickup region, the plurality of regions including a first region and a second region, each of the plurality of contact units and first wiring lines is provided for a respective pixel in the pixel-array section, and positions of contact units and first wiring lines arranged in the first region are opposite to positions of corresponding contact units and first wiring lines arranged in the second region.

2. The solid-state image-pickup device according to claim 1, wherein the wiring layer further includes a plurality of second wiring lines, each of the plurality of contact units being adjacent but not connected to a corresponding second wiring line, and, in the first and second regions, the corresponding second wiring line is arranged such as to be closer to a center of the pixel-array section than the adjacent contact unit.

3. The solid-state image-pickup device according to claim 2, wherein the plurality of second wiring lines are formed at a pitch that is shifted in a direction in which the pupil correction is performed on the microlenses.

4. The solid-state image-pickup device according to claim 2, wherein the plurality of second wiring lines are vertical signal lines for transmitting pixel signals.

5. The solid-state image-pickup device according to claim 1, wherein the image-pickup region is divided in the vertical direction of the pixel-array section to obtain the first and second regions.

6. The solid-state image-pickup device according to claim 1, wherein the image-pickup region is divided in the horizontal direction of the pixel-array section to obtain the first and second regions.

7. The solid-state image-pickup device according to claim 1, wherein the plurality of regions are at least four regions, and the image-pickup region is divided in the horizontal and vertical directions of the pixel-array section to obtain the at least four regions.

8. The solid-state image-pickup device according to claim 1, wherein, to obtain the plurality of regions, the image-pickup region is divided in a direction along which a number of pixels in the pixel-array section is larger than along another direction.

9. The solid-state image-pickup device according to claim 1, wherein the first the plurality of contact units are contact units that are respectively connected to floating diffusion units for obtaining signal charges from the photoelectric conversion units.

* * * * *